United States Patent
Bishop et al.

(10) Patent No.: US 9,985,344 B2
(45) Date of Patent: May 29, 2018

(54) ELECTRONIC ARTICLE AND PROCESS OF PRODUCING AN ELECTRONIC ARTICLE

(71) Applicant: Tyco Electronics Corporation, Berwyn, PA (US)

(72) Inventors: Bruce Foster Bishop, Aptos, CA (US); James Paul Scholz, Mechanicsburg, PA (US); Jerry L. Moore, Mechanicsburg, PA (US); Michael A. Oar, San Francisco, CA (US); Leonard Henry Radzilowski, Palo Alto, CA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 146 days.

(21) Appl. No.: 14/581,707

(22) Filed: Dec. 23, 2014

(65) Prior Publication Data

US 2016/0181689 A1  Jun. 23, 2016

(51) Int. Cl.

| *H01Q 1/36* | (2006.01) |
| *H01Q 1/08* | (2006.01) |
| *H01Q 1/38* | (2006.01) |
| *H01Q 1/22* | (2006.01) |
| *H01Q 1/40* | (2006.01) |
| *H05K 3/12* | (2006.01) |
| *H05K 3/24* | (2006.01) |

(52) U.S. Cl.
CPC ............ *H01Q 1/364* (2013.01); *H01Q 1/085* (2013.01); *H01Q 1/22* (2013.01); *H01Q 1/38* (2013.01); *H01Q 1/40* (2013.01); *H05K 3/125* (2013.01); *H05K 3/246* (2013.01); *H05K 2201/09681* (2013.01)

(58) Field of Classification Search
CPC ............ H01Q 1/36; H01Q 1/364; H01Q 1/38; H01Q 1/085; H01Q 1/40; H01Q 1/22; H05K 3/1283; H05K 1/092
See application file for complete search history.

(56) References Cited

U.S. PATENT DOCUMENTS

| 2008/0291095 A1 | 11/2008 | Krishtul |
| 2010/0045532 A1 | 2/2010 | Ryou et al. |
| 2010/0097273 A1 | 4/2010 | Biris et al. |

(Continued)

FOREIGN PATENT DOCUMENTS

| EP | 2693564 A1 | 2/2014 |
| WO | WO-2013/128289 A2 | 9/2013 |

OTHER PUBLICATIONS

International Search Report for International Application No. PCT/US2015/067179, dated Apr. 4, 2016.

*Primary Examiner* — Hoang Nguyen

(57) ABSTRACT

Electronic articles, antennae, and processes of producing electronic articles are disclosed. The electronic article includes a rigid substrate having a non-planar region and a sintered conductive ink positioned on the non-planar region. The antenna is a specific type of electronic article covered by the disclosure. Additionally or alternatively, the antenna has a light transmission of at least 85%. The process includes positioning a substrate having a non-planar region, applying a conductive ink to the non-planar region, and sintering the conductive ink on the non-planar region thereby producing the sintered conductive ink on the electronic article and/or producing an antenna having a light transmission of at least 80%.

15 Claims, 2 Drawing Sheets

(56) References Cited

U.S. PATENT DOCUMENTS

| | | |
|---|---|---|
| 2011/0042125 A1 | 2/2011 | Lee et al. |
| 2012/0249660 A1 | 10/2012 | Schuster |
| 2014/0328036 A1* | 11/2014 | Sarraf .................... H05K 1/092 |
| | | 361/760 |
| 2015/0123851 A1* | 5/2015 | Bohrer ..................... H01Q 1/38 |
| | | 343/700 MS |
| 2015/0240101 A1* | 8/2015 | Chopra ................ C09D 131/04 |
| | | 252/514 |

* cited by examiner

ELECTRONIC ARTICLE AND PROCESS OF PRODUCING AN ELECTRONIC ARTICLE

FIELD OF THE INVENTION

The present invention is directed to electronic articles and processes of producing electronic articles with conductive ink. More particularly, the present invention is directed to conductive inks in such electronic articles.

BACKGROUND OF THE INVENTION

There is a strong trend in electronic consumer devices to reduce the thickness of every component so that overall dimensions of such devices can be reduced. Substrates for antennas are no exception. However, thinner substrates are incompatible with certain processes and materials. For example, the desire to use thinner substrates is tempered with the difficulty of maintaining or increasing conductivity of antennas prepared on such substrates.

There is also a trend in consumer devices to increase the number of antennas in a device, the number of traces within an antenna, and/or the complexity of antennas. Such desires further complicate the ability to decrease the thickness of antennas.

In addition to decreasing thickness and maintaining or increasing conductivity of antennas, there is also an ongoing desire to make antennas transparent or less noticeable. For example, wearable electronics and devices containing liquid crystal display (LCD) screens, such as, watches, televisions/monitors, cellular telephones, and tablets, can have a bezel area surrounding the LCD screen, allowing for the antenna to be included therein. Such bezel areas are decreasing in size or being eliminated, thereby causing a need for antennas to be smaller and/or transparent.

Increasing transparency is especially difficult because the percent transmission of light is generally inversely proportional to the level of conductivity and the thickness of a material. As such, there is an ongoing desire to produce a material arrangement with conductive traces having high light transmission rate (for example, greater than 80%), with conductive traces having a high level of conductivity (for example, based upon a sheet resistance of less than 0.1 ohms/square), and with devices having a low thickness (for example, less than 300 micrometers).

A known attempt to achieve these desired features is by use of indium tin oxide (ITO). ITO allows higher conductivity, but decreases light transmission rate as thickness is increased to achieve desired levels of conductivity. Maintaining ITO at a lower thickness for desired light transmission, results in too low conductivity.

Electronic articles and processes of producing electronic articles that show one or more improvements in comparison to the prior art would be desirable in the art.

BRIEF DESCRIPTION OF THE INVENTION

In an embodiment, an electronic article includes a rigid substrate having a non-planar region and a sintered conductive ink positioned on the non-planar region.

In another embodiment, an antenna includes a substrate and a conductive ink positioned on the substrate, the conductive ink being formed from a conductive ink having a metal nanostructure, an organic solvent, and a capping agent. The conductive ink has a light transmission of at least 80%.

In another embodiment, a process of producing an electronic article having a sintered conductive ink includes positioning a substrate having a non-planar region, applying a conductive ink to the non-planar region, and sintering the conductive ink on the non-planar region thereby producing the sintered conductive ink on the electronic article.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided are electronic articles (for example, antennas) and processes of producing electronic articles. Embodiments of the present disclosure, for example, in comparison to concepts failing to include one or more of the features disclosed herein, permit electronic articles to have reduced thickness without sacrificing conductivity, permit electronic articles to have transparent or semi-transparent portions without sacrificing conductivity, permit a wider range of applications for conductive inks, permit reduction or elimination of the bezel area of certain electronic components, permit electronic articles and components to be smaller, or permit any suitable combination thereof.

Figure 1:
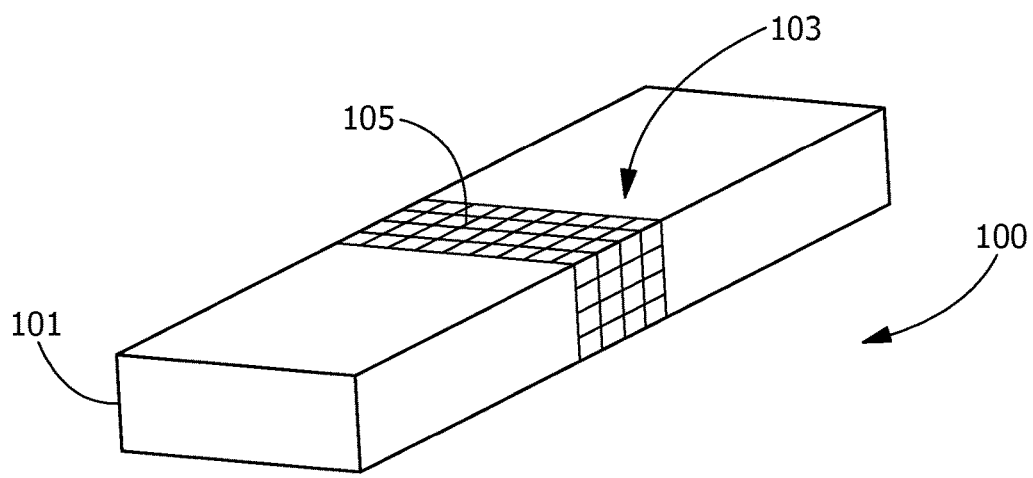
FIG. 1 is a perspective view of a curved antenna having a sintered conductive ink, according to the disclosure.
Figure 2:
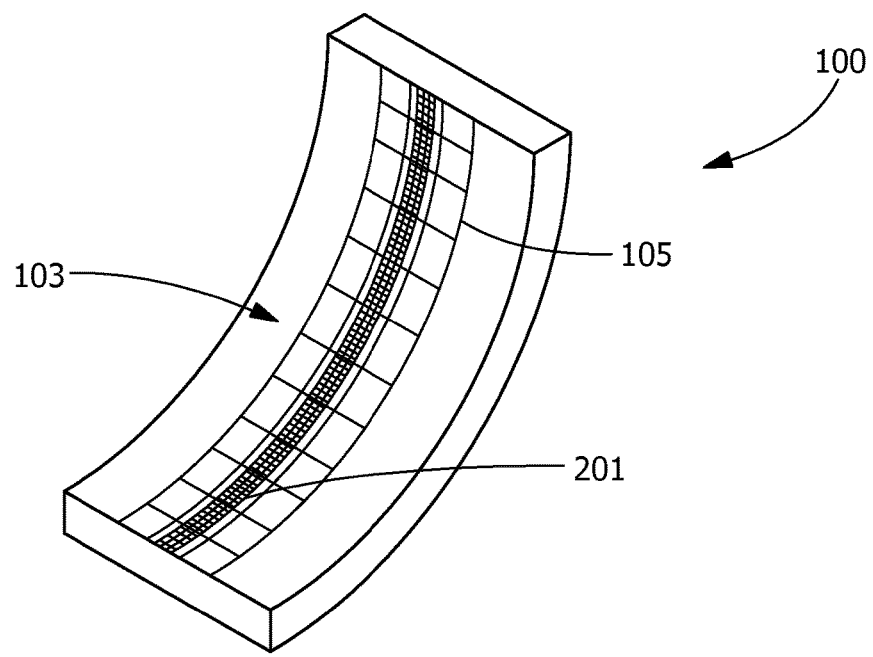
FIG. 2 is a perspective view of a cuboid antenna having a sintered conductive ink and an additional ink, according to the disclosure.
Figure 3:
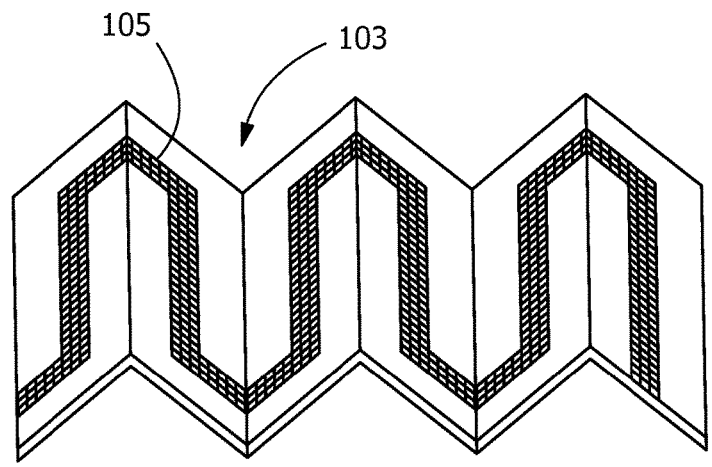
FIG. 3 is a perspective view of a pointed antenna having a sintered conductive ink, according to the disclosure.

FIGS. 1 to 3 show an electronic article, specifically an antenna 100, including a rigid substrate 101 having a non-planar region 103. The rigid substrate 101 is or includes a polymeric material (for example, polycarbonate materials, polyamide materials), a film (for example, a transparent polymeric film, polyimide materials, or polyethylene terephthalate materials), or any other suitable material capable of receiving a conductive ink.

The conductive ink, for example, a non-sintered conductive ink or a sintered conductive ink 105 is produced on the non-planar region 103 from a conductive ink. The electronic article is produced by providing a substrate (for example, the rigid substrate 101 or a flexible substrate) applying the conductive ink to the substrate on the non-planar region 103 (for example, by inkjet printing), and sintering the conductive ink (for example, at a temperature of between 120° C. and 180° C., between 130° C. and 150° C., and/or between 140° C. and 150° C.), thereby producing the sintered conductive ink 105 on the antenna 100 or other suitable electronic article.

The electronic article is capable of being cuboid or substantially cuboid as shown in FIG. 1, curved as shown in FIG. 2, pointed as shown in FIG. 3, or any other suitable geometry corresponding to the desired application. For example, in addition to the antenna 100, the electronic article is capable of being or being within a sensor, a wearable electronic device, a device containing a liquid crystal display (LCD) screen (such as, a watch, a television/monitor, a cellular telephone, an athletic band, and/or a tablet), or any other suitable electronic device.

The sintered conductive ink 105 is any suitable conductive trace material. One suitable material includes a metal nanostructure, an organic solvent, and a capping agent. Another suitable material includes organometallic, particle-free inks, for example, that nucleate metal nanoclusters in response to solvent evaporation.

The metal nanostructure is or includes, for example, copper, silver, annealed silver, gold, aluminum, tin, nickel, alloys thereof, and combinations thereof. Suitable morphologies of the nanostructure include, but are not limited to, having flakes, dendrites, spheres, granules, or combinations thereof.

The organic solvent is or includes, for example, ethanol, isopropyl alcohol, methanol, any other solvent compatible with the metal nanostructure, or a combination thereof.

The capping agent is or includes, for example, poly (vinylpyrrolidone) (PVP), polyaniline (PAN), L-cysteine (L-cys), oleic acid (OA), any other capping agent compatible with the solvent, or a combination thereof.

The sintered conductive ink 105 is positioned on the non-planar region 103 extending a depth from the rigid substrate 101 that provides the desired conductivity for the specific application of use. Suitable depths include, but are not limited to, between 6 and 100 micrometers, between 6 and 20 micrometers, between 8 to 10 micrometers, between 10 to 20 micrometers, between 20 and 60 micrometers, between 60 and 100 micrometers, or any suitable combination, sub-combination, range, or sub range therein.

In one embodiment, the trace depth 405 of the sintered conductive ink 105 is greater than or equal to the skin depth of the composition for the specific embodiment of the sintered conductive ink 105. In some embodiments, the trace depth 405 is greater than the skin depth by at least a factor of three, a factor of four, or a factor of five. In general, the skin depth of a material is smaller for a higher conductive material and larger for a lower conductive material. The skin depth is able to be determined by the following equation:

$$\delta = \frac{1}{\sqrt{\pi f \mu \sigma}} \quad \text{(Eq. 1)}$$

where, $\delta$ is the skin depth, f is frequency, $\mu$ is permeability, and $\sigma$ is conductivity. Based upon this, in one embodiment with the sintered conductive ink 105 including silver-containing ink, the sintered conductive ink 105 has a resistivity of 0.0001 ohm·cm, 0.00001 ohm·cm, or 0.0000017 ohm·cm. The skin depth of the sintered conductive ink 105 having the 0.0001 ohm·cm resistivity extends from 23 micrometers at 1,000 MHz to below 10 micrometers at 3,000 MHz and to 7 micrometers at 6,000 MHz. The skin depth of the sintered conductive ink 105 having the 0.00001 ohm·cm resistivity extends from 7 micrometers at 1,000 MHz to below 4 micrometers at 3,000 MHz and to 3 micrometers at 6,000 MHz. The skin depth of the sintered conductive ink 105 having the 0.0000017 ohm·cm resistivity extends from 3 micrometers at 1,000 MHz to below 2 micrometers at 3,000 MHz and to 2 micrometers at 6,000 MHz.

The trace width 403 (see FIG. 4) of the sintered conductive ink 105 similarly is any width that provides the desired conductivity for the specific application of use. Suitable widths include, but are not limited to, between 20 and 30 micrometers, between 30 and 40 micrometers, between 0.5 millimeters and 1 millimeters, between 0.5 millimeters and 2 millimeters, or any suitable combination, sub-combination, range, or sub range therein.

The mean surface roughness of the sintered conductive ink 105 is any suitable value sufficiently low enough for the specific application of use. Suitable mean surface roughness values include, but are not limited to, less than 10 micrometer, less than 7 micrometer, less than 5 micrometer, less than 3 micrometer, less than 1 micrometer, less than 0.6 micrometers, between 0.1 micrometers and 1 micrometers, or any suitable combination, sub-combination, range, or sub range therein. In one embodiment, the mean surface roughness of the sintered conductive ink 105 allows for calculation of a correction factor in the following equation:

$$R' = \frac{1}{w}\sqrt{\frac{\pi \mu f}{\sigma}} \quad \text{(Eq. 2)}$$

$$c = \left[1 + \frac{2}{\pi}\tan^{-1}\left\{1.4\left(\frac{\Delta}{\delta}\right)^2\right\}\right]$$

$$R_s = c \cdot R'.$$

where R' is resistance per unit length, w is trace width, $\mu$ is permeability, f is frequency, $\sigma$ is conductivity of the conductor, $R_s$ is surface roughness resistance per unit length, c is correction factor, $\Delta$ is mean surface roughness, and $\delta$ is skin depth. In a further embodiment, the correction factor c is between 0.9 and 1.1, between 0.8 and 1.2, or any suitable combination, sub-combination, range, or sub range therein.

The resistance of the sintered conductive ink 105 is any suitable value sufficiently low enough for the specific application of use. Suitable resistance values include, but are not limited to, less than 3 ohms/square, less than 1 ohms/square, less than 0.5 ohms/square, less than 0.02 ohms/square, or any suitable combination, sub-combination, range, or sub range therein.

The light transmission/transparency rate for the sintered conductive ink 105 is sufficiently high enough for the specific application of use. Suitable light transmission rates include, but are not limited to, between 66% and 67%, between 67% and 70%, at least 66%, at least 84%, at least 88%, between 80% and 95%, between 88% and 90%, between 84% and 86%, or any suitable combination, sub-combination, range, or sub range therein.

In further embodiments, the electronic article includes additional materials and/or layers. For example, in one embodiment, the electronic article includes an additional ink 201, as shown in FIG. 2. The additional ink 201 is capable of being the same or different material in comparison to the sintered conductive ink 105. For example, in one embodiment, the additional ink 201 has the same composition as the sintered conductive ink 105 and the same microstructure (for example, due to being subjected to the same sintering conditions) or a different microstructure (for example, due to being subjected to different conditions in comparison to the sintered conductive ink 105).

In one embodiment, the additional ink 201 has a different composition in comparison to the sintered conductive ink 105. In this embodiment, the microstructure is different or similar to the microstructure of the sintered conductive ink 105. In a further embodiment, the additional ink 201 is curable, for example, having an increased cross-link density resulting from curing conditions, for example, from exposure to ultraviolet light, electron beam radiation, catalysts, any other suitable curing technique, or a combination thereof.

In one embodiment, a conductive material is built up, for example, through electroplating to form the sintered conductive ink 105 and/or the additional ink 201. For example, mesh metal structures of copper are electroplated with a lower-resistivity conductive material, such as silver. The built up mesh metal particles with the lower-resistivity conductive material cause the conductive ink to drastically decrease in resistance toward the beginning of the electroplating (for example, from 6.3 ohms/square to less 2.5 ohms/square or less than 0.5 ohms/square during a period of 180 seconds) and less drastically during further electroplating (for example, to less than 1 ohms/square or less than 0.4 ohms/square after an additional 60 seconds).

The electroplating also increases the trace depth 405 and the trace width 403 of the sintered conductive ink 105 and/or the additional ink 201, for example, from a 2.5 micrometer depth and a 12 micrometer width to a 4 micrometer depth and a 17 micrometer thickness after 180 seconds, to a 5 micrometer depth and a 18 micrometer width after another 60 seconds, and to a 6.5 micrometer depth and a 19 micrometer width after yet another 60 seconds.

Figure 4:
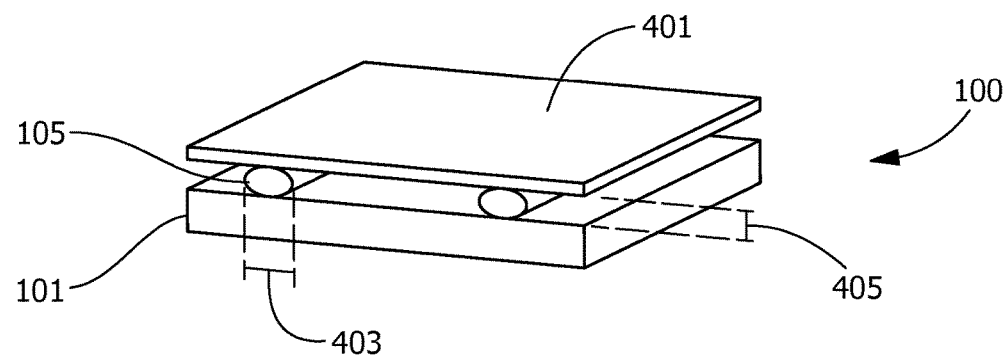
FIG. 4 is a perspective view of an antenna having a sintered conductive ink at least partially surrounded by a post-plated layer, according to the disclosure.

Referring to FIG. 4, in one embodiment, the electronic article includes a post-plated layer 401 positioned on the rigid substrate 101. The post-plated layer 401 at least partially surrounds the sintered conductive ink 105 and/or the additional ink 201 that is/are at least partially positioned between the post-plated layer 401 and the rigid substrate 101. In further embodiments, the sintered conductive ink 105 and/or the additional ink 201 is/are in contact with the post-plated layer 401, in contact with the rigid substrate 101, enclosed by the rigid substrate 101 and the post-plated layer 401, and/or accessible without removal of the rigid substrate 101 and/or the post-plated layer 401.

EXAMPLES

In a first example, a comparative example, copper lines are plated onto a polyimide film coated with a catalytic seed layer and then lithographically patterned into a square grid. The line spacing is 1 millimeter, the trace width is 15 micrometers, and the trace depth is 2.8 micrometers. The sheet resistance is 1.0 ohms/square and the light transmission is 88%. Achieving such sheet resistance and light transmission limits the ability to decrease the trace depth.

In a second example, a comparative example, copper lines are plated onto a polyimide film coated with a catalytic seed layer and then lithographically patterned into a square grid. Then, the lines are plated with silver ink. Prior to plating with the silver ink, the line spacing is 1 millimeter, the trace width is 15 micrometers, and the trace depth is 2.8 micrometers. After the silver plating, the trace width is 25 micrometers and the trace depth is 5.8 micrometers. The sheet resistance remains at 1.0 ohms/square, likely due to fracture and delamination, and the light transmission decreases to 87%. The lack of a decrease in sheet resistance coupled with the decrease in light transmission suggests that, for such inks and processes, the increase in trace depth is detrimental.

In a third example, a conductive grid on polyethylene terephthalate is produced by applying a nanoparticle silver ink via inkjet printing and sintering at 140° C. Line spacing is 0.5 millimeters. Trace width is 25 micrometers. Trace depth is 0.2 micrometers. The sheet resistance is over 1 megaohm per square and the light transmission is 89%. The high sheet resistance suggests that too small of a trace depth is present.

In a fourth example, a conductive grid on polyethylene terephthalate is produced by applying a nanoparticle silver ink via inkjet printing, sintering at 140° C., and then electroplating with silver. Line spacing begins 0.5 millimeters. Trace width is 35 micrometers. Trace depth is 2.5 micrometers. The sheet resistance is 3 ohms/square and the light transmission is 85%, believed to be lower due to incomplete traces from the inkjet printing process. Accordingly, the fourth example illustrates that lower trace depth is capable of being achieved consistent with the disclosure, while having a high level of light transmission, through the additional electroplating. The fourth example also illustrates that increases in the trace depth, when electroplated, produce decreased sheet resistance.

In a fifth example, a conductive ink a curved substrate is produced by applying a nanoparticle silver ink via inkjet printing, sintering at 120° C., and then electroplating with silver. Trace depth is 19 micrometers and sheet resistance is 4 ohms/square.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. An electronic article, comprising:
   a rigid substrate having a non-planar region; and
   a sintered conductive ink positioned on the non-planar region, the sintered conductive ink having (i) a light transmission of at least 80%, and (ii) a trace depth of 6 to 20 micrometers.

2. The electronic article of claim 1, wherein the sintered conductive ink has a trace depth of 8 to 10 micrometers.

3. The electronic article of claim 1, wherein the sintered conductive ink has a trace depth of 10 to 20 micrometers.

4. The electronic article of claim 1, wherein the sintered conductive ink includes a metal nanostructure, an organic solvent, and a capping agent.

5. The electronic article of claim 1, wherein the sintered conductive ink has a sheet resistance of less than 3 ohms/square.

6. The electronic article of claim 5, wherein the sintered conductive ink has a sheet resistance of less than 1 ohms/square.

7. The electronic article of claim 6, wherein the sintered conductive ink has a sheet resistance of less than 0.5 ohms/square.

8. The electronic article of claim 7, wherein the sintered conductive ink has a sheet resistance of less than 0.02 ohms/square.

9. The electronic article of claim 1, wherein the electronic article comprises a cured ink positioned on the rigid substrate.

10. The electronic article of claim 1, further comprising a post-plated layer being positioned on the rigid substrate and the sintered conductive ink being at least partially positioned between the post-plated layer and the rigid substrate.

11. The electronic article of claim 1, wherein the electronic article is an antenna.

12. An electronic article, comprising:
   a rigid substrate having a non-planar region; and
   a sintered conductive ink positioned on the non-planar region, the sintered conductive ink having (i) a light transmission of at least 80%, and (ii) a trace width of 30 to 40 micrometers or 20 to 30 micrometers.

13. An electronic article, comprising:
   a rigid substrate having a non-planar region; and
   a sintered conductive ink positioned on the non-planar region, the sintered conductive ink having (i) a light transmission of at least 80%, and (ii) a mean surface roughness of less than 10 micrometers.

14. The electronic article of claim 13, wherein the sintered conductive ink has a mean surface roughness of less than 0.6 micrometers.

15. A process of producing an electronic article having a sintered conductive ink, comprising:
   positioning a rigid substrate having a non-planar region;
   applying a conductive ink to the non-planar region; and
   sintering the conductive ink on the non-planar region thereby producing the sintered conductive ink on the electronic article, said sintered conductive ink having (i) a light transmission of at least 80%, and (ii) a trace depth of 6 to 20 micrometers.

* * * * *